United States Patent [19]
McNutt et al.

[11] Patent Number: 5,322,438
[45] Date of Patent: Jun. 21, 1994

[54] LAYOUT SCHEME FOR PRECISE CAPACITANCE RATIOS

[75] Inventors: Michael McNutt, El Toro; Russell Hershbarger, Nevada City, both of Calif.

[73] Assignee: Silicon Systems, Inc., Tustin, Calif.

[21] Appl. No.: 79,646

[22] Filed: Jun. 18, 1993

[51] Int. Cl.$^5$ .......................................... H01L 21/70
[52] U.S. Cl. ..................................... 437/51; 437/60; 437/919
[58] Field of Search ........................... 437/51, 60, 919

[56] References Cited
PUBLICATIONS

Yaghutiel, H. et al., "Automatic Layout of Switched Capacitor Filters for Custom Applications", 1988 IEEE Int. Solid State Circuits Conference, pp. 170-171.

*Primary Examiner*—Tom Thomas
*Attorney, Agent, or Firm*—Hecker & Harriman

[57] ABSTRACT

The present invention relates to the field of capacitor layout schemes for integrated circuits. A method comprising nine specific layout criteria is disclosed that eliminates or greatly suppresses problems of prior art capacitance matching. The nine layout criteria for providing precise capacitance ratios are: 1) fixed horizontal and vertical spacings are maintained for unit capacitors; 2) grounded dummy unit capacitors are placed around the periphery of each capacitor group; 3) two interconnects are used per unit capacitor; 4) equal numbers of top and bottom external interconnects per capacitance are maintained; 5) the external interconnect capacitance is made equal to the internal interconnect capacitance; 6) nonunit capacitors are used in the largest capacitance in a ratio; 7) the top plate interconnect of a capacitance is isolated from the bottom plate interconnect of the same capacitance; 8) interconnects are shielded from opposite capacitor plates; and, 9) rows of unit capacitors of the same capacitance are isolated from each other. This layout scheme provides improved accuracy and reproducibility for capacitance matching in silicon integrated circuits. Another advantage of this method is that, by limiting the options available for laying out matched capacitor structures, the layout process is streamlined in a manner that reduces time and, in particular, lends itself to automation. Still another advantage of it is that less space is required for the same circuit in most cases.

6 Claims, 4 Drawing Sheets

1

LAYOUT SCHEME FOR PRECISE CAPACITANCE RATIOS

BACKGROUND OF THE INVENTION

1. Field of the Invention

The present invention relates to the field of capacitor layout schemes for integrated circuits.

2. Background Art

In analog and mixed signal integrated circuit applications, capacitance ratios are used to precisely determine a specified output quantity or value. Examples of such applications include the chord ratio in a digital-to-analog converter (DAC) as well as the filter frequency for a switched capacitor circuit. Capacitors are typically formed of two polysilicon layers where POLY1 and POLY2 denote the bottom and top layers, respectively. The two polysilicon layers, or plates, sandwich a thin layer (typically 250 Å–500 Å) of thermally grown silicon dioxide, thereby forming a MOS capacitor structure.

Capacitor ratios are used instead of an absolute capacitance value, so that the effects of small variations in photolithography masks and wafer processing are suppressed. In practice, unit capacitors are used as building blocks. A unit capacitor, or unit cell, is a capacitor having a standard, predetermined size and shape, typically a square. All capacitors on an integrated circuit that are to be related to each other by predetermined capacitor ratios are made of groups or arrays of electrically interconnected unit cells. The unit capacitors are connected together to form larger capacitances that are the numerator or denominator of a capacitance ratio. Since the unit capacitors are identical and are processed simultaneously, mask and processing variations should not vary across the relevant portion of a die. In theory, these variations affect each unit capacitor equally and, therefore, have no effect on the capacitance ratios.

The accuracy of capacitance ratios has a significant effect on integrated circuit performance. For example, the chord ratio of an 8-bit DAC requires 0.4% accuracy and a 10-bit chord ratio requires 0.1% accuracy. A high Q notch filter centered at 1786 Hz that has a 0.4% accuracy has a possible error shift of 7 Hz. Such an error shift can significantly affect the attenuation at the design frequency. Circuit designers can efficiently convert 0.1% capacitor ratio accuracy into higher performance; one tenth of a percent (0.1%) of a 20 $\mu$m unit capacitor is only 0.02 $\mu$m or 200 Å.

In practice, however, there are several nonideal characteristics, both known and predicted, that undermine the accuracy of the capacitance ratios.

A disadvantage of the prior art are proximity effects in the photolithography and etching steps that produce variations in individual capacitor sizes. For example, the distance between a unit capacitor and its nearest neighbor has an effect upon the exposure, photoresist development, and etching of a unit capacitor edge. This occurs as result of chemical loading or optical interference. Limited improvement has been made by placing guard-rings around each group of unit capacitors. However, the amount of etched area within an area perimeter of an edge can also affect chemical loading. This area has been shown to extend as far as 50 $\mu$m from the edge.

Another disadvantage of the prior art is that the POLY1 capacitor plate is normally common to all of the unit capacitors that form one capacitance. Therefore, depending on the location of a unit capacitor within a group of unit capacitors, the fringe capacitance between the top of the POLY2 unit capacitor plate and the common POLY1 plate varies. Models indicate that the variation can be as much as 0.4% among 27 $\mu$m unit capacitors. This problem is worsened by the fact that the fringe capacitance varies according to the dielectric constant of the material many microns above the POLY2 layer. The material above the POLY2 layer is primarily air which has a dielectric constant $\epsilon$ of $\epsilon_o$ ($8.86 \times 10^{-14}$ F/cm) at wafer probe and plastic filler ($\epsilon = 3.8\epsilon_o$) at package test.

A further disadvantage of the prior art is that unit capacitors in a capacitance are connected together with metal interconnect lines, and these lines run over the POLY1 plate between the POLY2 plates. This produces parasitic capacitance that is about 1.3 Fl or about 0.25% of the unit capacitance in a typical 27 $\mu$m design. Therefore, the number of interconnects per unit capacitor must be kept constant to prevent any mismatch. This is complicated by the fact that some of the interconnects are between unit capacitors in a group and others connect the group to external circuitry. These latter interconnects cross the edge of the POLY1 plate where the exposed POLY1 length is different than the length between unit capacitors. The exposed POLY1 length at the edge is subject to misalignment between the POLY1 and POLY2 layers; also, there is additional fringe capacitance at the edge. Thus, the interconnects are usually not apportioned exactly into ratios.

Yet another disadvantage of the prior art is that there must be two interconnects from unit capacitor groups (called capacitances here) to external circuitry where one is for the series of POLY2 upper plates and one is for the POLY1 lower plate. When these two interconnects run close to each other or the upper plate POLY2 interconnect runs next to the lower plate POLY1, significant parasitic capacitance results.

Another disadvantage of the prior art is that, in order for the capacitance ratio to remain constant despite small but uniform variations in unit capacitor linewidth, the capacitance perimeter ratio must be the same as the capacitance area ratio. In this way, a small overetch or underetch produces the same proportional change in the numerator and denominator capacitance. If the desired ratio is an integer as in a DAC, the use of unit capacitors accomplishes this automatically. However, in a filter, the ratio is typically a non-integral number, and one non-unit capacitor must be used to produce the proper perimeter ratio.

SUMMARY OF THE PRESENT INVENTION

The present invention relates to the field of capacitor layout schemes for integrated circuits. A method comprising nine layout criteria is disclosed that eliminates or greatly suppresses problems of prior art capacitance matching.

The accuracy of capacitance ratios has a significant effect on integrated circuit performance. By using capacitor ratios rather than an absolute capacitance value, the effects of small variations in photolithography masks and wafer processing are reduced. In practice, however, there are several nonideal characteristics, both known and predicted, that undermine the accuracy of the capacitance ratios.

To improve the accuracy of capacitance ratios, the layout method according to the present invention maintains fixed horizontal (X) and vertical (Y) spacings for unit capacitors. Grounded dummy unit capacitors are placed around the periphery of each capacitor group. Two interconnects are used per unit capacitor to connect to other unit capacitors forming a capacitance. Equal numbers of top and bottom external interconnects per capacitance are maintained. The external interconnect capacitance is made equal to the internal interconnect capacitance. Nonunit capacitors are used in the largest capacitance in a ratio. The top plate interconnect of a capacitor is isolated from the bottom plate interconnect of the same capacitor. Interconnects are shielded from opposite capacitor plates. Rows of unit capacitors of the same capacitance are isolated from each other.

The layout scheme according to the present invention discloses an advantage of improved accuracy and reproducibility for capacitance matching in silicon integrated circuits. The improved accuracy and repeatability can be used to increase the yield at a fixed performance, or it can be used to maintain the yield at a higher performance. Thus, the yield-performance tradeoff in circuits is enhanced. Another advantage of the present invention over the prior art is that, by limiting the options available for laying out matched capacitor structures, the layout process is streamlined in a manner that reduces time and, in particular, lends itself to automation. Still another advantage of the present invention over the prior art is that less space is required for the same circuit in most cases.

DETAILED DESCRIPTION OF THE PRESENT INVENTION

A layout scheme for precise capacitance ratios is described. In the following description, numerous specific details, such as number and nature of unit capacitors, unit capacitor placement, polysilicon types, etc., are described in detail in order to provide a more thorough description of the present invention. It will be apparent, however, to one skilled in the art, that the present invention may be practiced without these specific details. In other instances, well-known features have not been described in detail so as not to unnecessarily obscure the present invention.

The method of the present invention eliminates or greatly suppresses the problems of capacitance matching described above.

Figure 1:
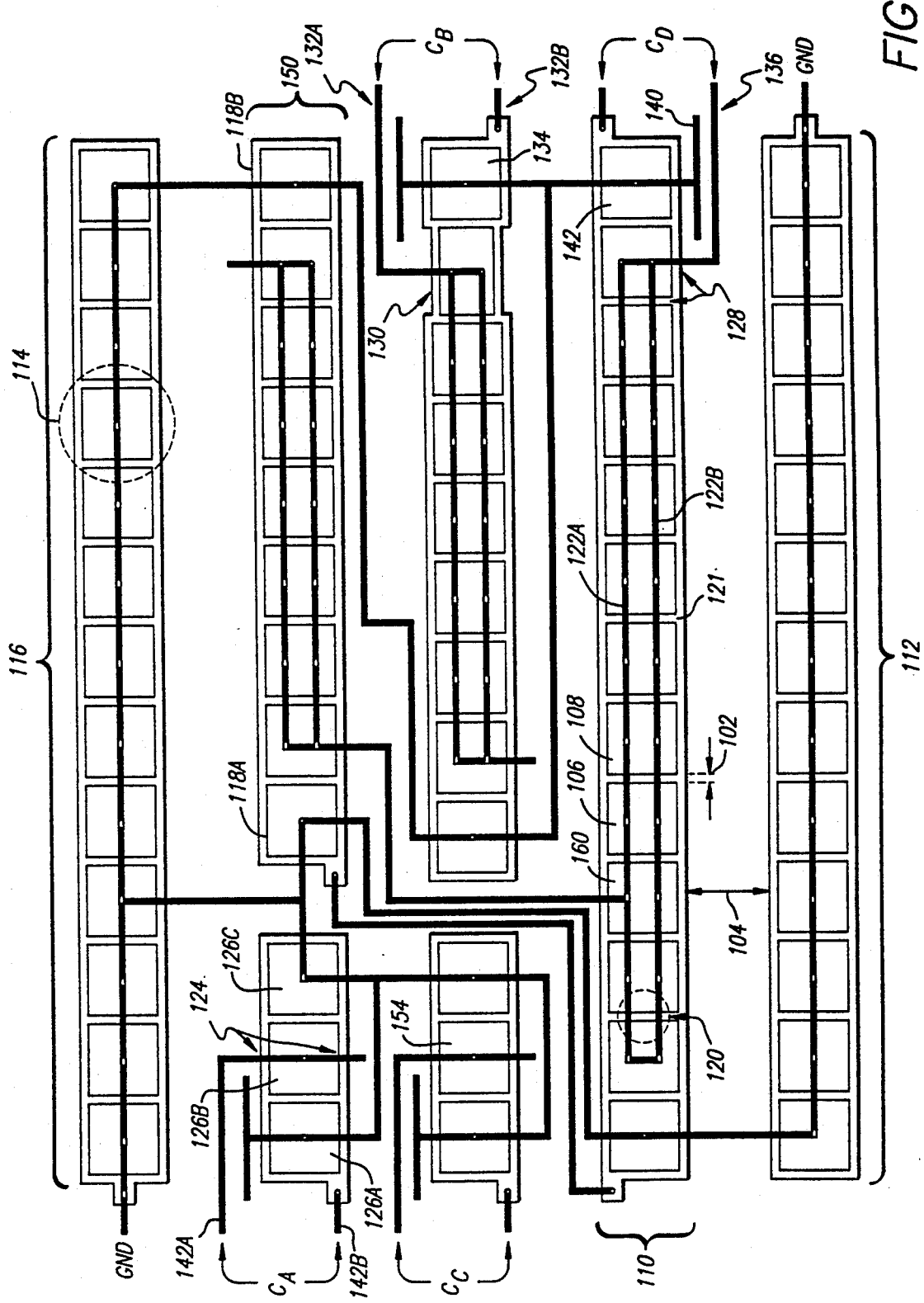
FIG. 1 is a detailed diagram of a typical capacitor layout.

A typical layout of capacitors shown in FIG. 1 illustrates the present invention. This layout employs routine practice to match the drawn perimeter ratios to the drawn area ratios of the capacitances. The layout scheme in FIG. 1 is designed to increase the accuracy of capacitance ratios. The capacitance layout scheme of FIG. 1 comprises four capacitances $C_A$–$C_D$ and two grounded dummy unit capacitor rows 112 and 116.

Capacitance $C_A$ comprises a single unit capacitor 126B organized in a single row having interconnects 142A–142B coupled to the top and bottom plates, respectively. Unit capacitor 126B is bracketed by grounded dummy unit capacitors 126A and 126C. Capacitance $C_B$ comprises 6 unit capacitors and a nonunit capacitor 130 across interconnects 132A and 132B; it is organized in a single row having grounded dummy unit capacitors at each end. Capacitance $C_C$ comprises a single unit capacitor 154 organized in a single row; unit capacitor 154 is bracketed by grounded unit dummy capacitors. Capacitance $C_D$ comprises two rows 110 and 150; row 110 comprises 11 unit capacitors (including 106 and 108) and two grounded dummy unit capacitors, while row 150 comprises 7 unit capacitors and two grounded dummy unit capacitors 118A–118B.

Figure 2:
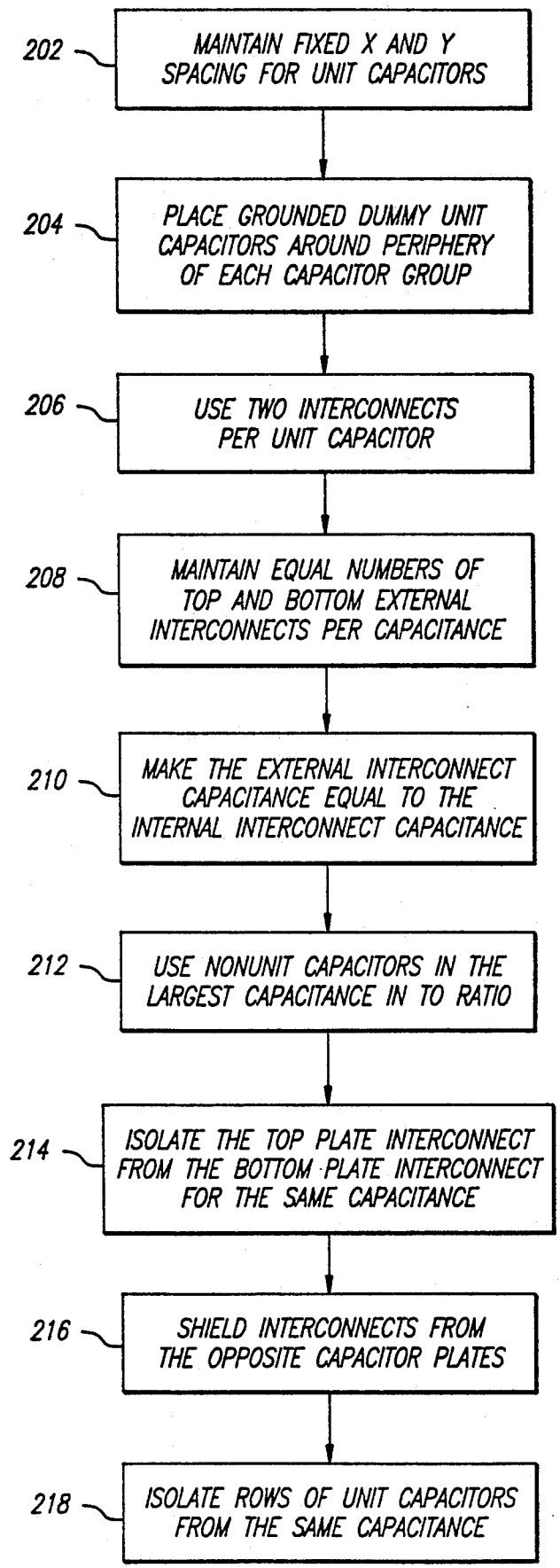
FIG. 2 is a flowchart of a capacitor layout scheme according to the present invention.

FIG. 2 is a diagram illustrating the layout criteria of the present invention. It should be understood that each of the criterion may be performed in any order. FIG. 2 illustrates a sequence 202 to 218 for illustrative purposes only. The criteria may be reordered to progress from 218 to 202, or any random combination thereof. The flowchart shown in FIG. 2 is described with reference to FIG. 1.

In the first layout criterion (step 202), fixed horizontal (X) and vertical (Y) spacing is maintained for the unit capacitors. FIG. 1 shows fixed horizontal spacing 102 indicated by dashed lines and two arrows between unit capacitors 106 and 108. This includes a fixed channel width 104 for interconnect lines (four lines are allowed here) provided between each row of capacitors. Fixed vertical spacing 104 is indicated by a double-headed arrow between rows 110 and 112. All unit capacitors are spaced a fixed distance from each other (horizontal spacing 102 and vertical spacing 104) to equalize fringe capacitance effects and all proximity effects in the mask and wafer processes. The only exceptions are the dummy capacitors that are not part of the actual capacitance ratio.

Figure 3:
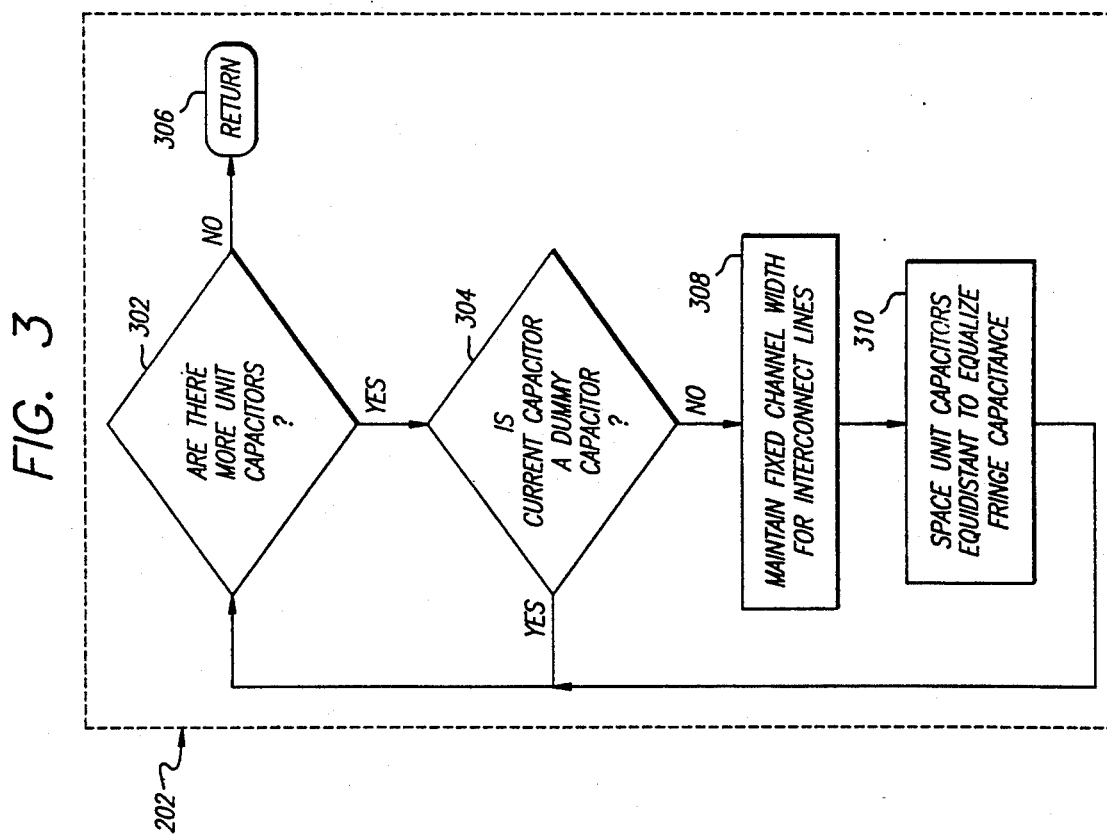
FIG. 3 is a flowchart illustrating step 202 of FIG. 2.

FIG. 3 is a detailed diagram of the first layout criterion shown in FIG. 2. In decision block 302, a check is made if there are more capacitors. If decision block 302 returns false (No), a return is executed at step 306; otherwise, execution continues at decision block 304. In decision block 304, a check is made if the current capacitor is a dummy capacitor. If decision block 304 returns true (Yes), execution continues at decision block 304; otherwise, execution continues at step 308. In step 308, a fixed channel width is maintained for interconnect lines. In step 310, unit capacitors are spaced equidistantly to equalize fringe capacitance, and execution continues at decision block 302.

In the second layout criterion (step 204), dummy unit capacitors 114 are placed around the periphery of each capacitor group. This insures that each capacitor in the capacitance ratios has the same peripheral environment whether it is at the top, bottom, left or right edge of the group. To accomplish this, dummy capacitor rows 112 and 116 are placed at the bottom and top of each large capacitor array (containing many capacitance groups), respectively, and dummy capacitors (i.e., 118A–118B) at the end of each capacitance or capacitor row. In FIG. 1, capacitances $C_A$ and $C_C$ each contain a single unit capacitor that is organized in a single group; each of these groups is bracketed by grounded dummy unit capacitors (i.e. dummy capacitors 126A and 126C for capacitance $C_A$). Capacitance $C_B$ is also organized in a single group of unit capacitors; however, capacitance $C_D$ is formed from two groups comprising rows 110 and 150. Each of the rows for capacitances $C_B$ and $C_D$ is also bracketed by grounded dummy unit capacitors (i.e., dummy capacitors 118A–118B).

The second layout criterion (step 204) is a corollary of first layout criterion (step 202), and insures that each unit capacitor in a capacitance ratio has the same environment at its edges. A version of this technique is described in U.S. Pat. No. 5,189,595 assigned to Silicon Systems, Inc.

In the third layout criterion (step 206), two interconnects 120 are used per unit capacitor. This is indicated in FIG. 1 by a dotted circle 120 about two interconnect lines connecting unit capacitors in row 110. Since a unit capacitor (i.e., unit capacitor 160 in row 110 of capacitance $C_D$) may require interconnects to external circuitry and to the rest of a unit capacitor group, it is necessary to standardize at two interconnects 122A and 122B per unit capacitor to maintain a parasitic interconnect capacitance ratio equal to the desired total capacitance ratio.

Nonunit capacitors have between one and two times the area of the unit capacitors. If the ratio of nonunit-to-unit capacitor is between 1 and 1.24, then two interconnects are used. This is illustrated in FIG. 1 by nonunit capacitor 130 of capacitance $C_B$. If the ratio is between 1.25 and 1.74, then three interconnects are used. If the ratio is greater than or equal to 1.75, four interconnects are used. If the unit capacitors are in a group with additional unit capacitors (see step 212), this approximation should be accurate. To obtain more accuracy, the width of one interconnect is adjusted.

Figure 5:
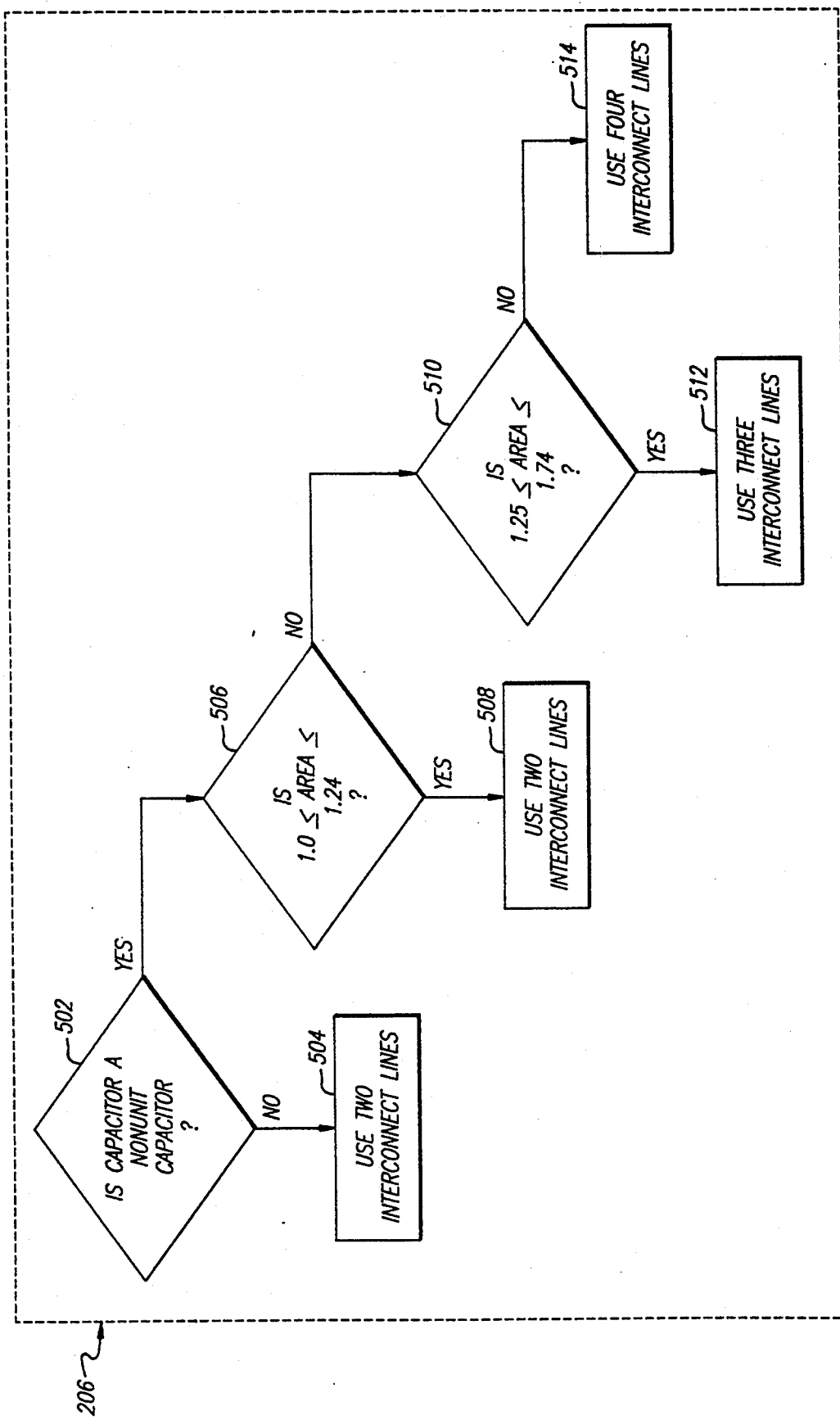
FIG. 5 is a flowchart illustrating step 206 of FIG. 2.

FIG. 5 is a detailed diagram illustrating the third layout criterion (step 206) shown in FIG. 2. In decision block 502, a check is made if the capacitor is a nonunit capacitor. If decision block 304 returns false (No), two interconnect lines are used at step 504; otherwise, execution continues at decision block 506. In decision block 506, a check is made if the area of the capacitor is greater than or equal to 1 and less than or equal to 1.24. If decision block 506 returns true (yes), two interconnect lines are used at step 508; otherwise, execution continues at decision block 510. In decision block 510, a check is made if the area of the capacitor is greater than or equal to 1.25 and less than or equal to 1.74. If decision block 510 returns true (yes), three interconnect lines are used at step 512; otherwise, four interconnect lines are used at step 514.

In the fourth layout criterion (step 208), equal numbers of top and bottom external interconnects per capacitance are maintained. This is shown in FIG. 1 by an arrow indicating interconnect 124 which vertically traverses unit capacitance 126. The fourth layout criterion (step 208) is necessary to protect against vertical (Y) misalignment of the POLY1 and POLY2 layers. If each capacitance has an interconnect at the top and bottom of a row of unit capacitors, then the vertical (Y) misalignment does not change the total parasitic capacitance of the interconnects. Many times, only one external interconnect is required, so the second external interconnect is a dummy that does not connect to anything.

In fifth layout criterion (step 210), the external interconnect capacitance is made equal to the internal interconnect capacitance. This is indicated in FIG. 1 by arrow 128. This is the only way that the two types of interconnects can be counted equally in the third layout criterion (step 206).

Figure 4:
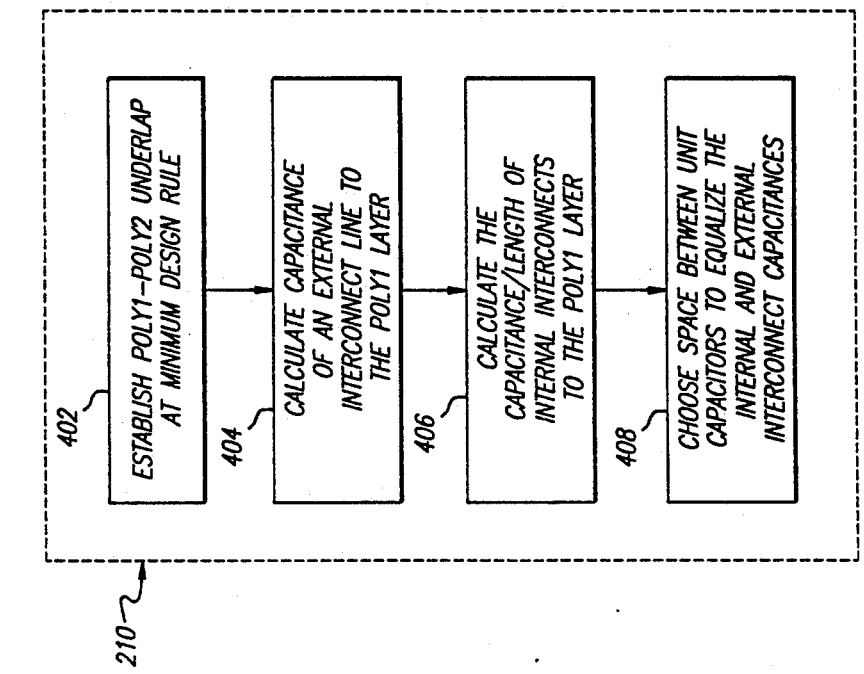
FIG. 4 is a flowchart illustrating step 210 of FIG. 2.

FIG. 4 is a detailed diagram illustrating the fifth layout criterion (step 210) shown in FIG. 2. This is normally realized in four steps. In step 402, the POLY1-POLY2 underlap is established at its minimum design criterion. In step 404, the capacitance of an external interconnect line to the POLY1 layer is calculated. In step 406, the capacitance/length of internal interconnects to the POLY1 layer are calculated. In step 408, the space between unit capacitors to equalize the internal and external interconnect capacitances is chosen.

For example, a typical process has a 3 $\mu$m minimum POLY1-POLY2 underlap, a 4 $\mu$m minimum metal width, and a 0.75 $\mu$m metal-POLY1 oxide thickness. The three dimensional metal-POLY1 capacitance approaches its asymptotic value of 1.29 fF when the metal-POLY1 overlap is 5 $\mu$m. This establishes the overlap required for dummy external interconnects. The two dimensional capacitance/length for the internal interconnect is 0.315 fF/$\mu$m, so the unit capacitor spacing required to equalize the capacitances is 1.29 fF ÷ 0.315 fF/$\mu$m which equals 4.1 $\mu$m.

In the sixth layout criterion (step 212), nonunit capacitors are used in the largest capacitance in a ratio. This is illustrated in FIG. 1 by nonunit capacitor 130 of capacitance $C_B$. The nonunit capacitors 130 cannot be treated precisely in terms of criteria 1 and 3 (steps 202 and 206). Therefore, it is preferable to use nonunit capacitors 130 in larger capacitances comprising many unit capacitors, so that the errors are a smaller percentage of the total capacitance.

In the seventh layout criterion (step 214), the top plate interconnect of a capacitor is isolated from the bottom plate interconnect of the same capacitor. This is indicated in FIG. 1 where the top plate interconnect 132A of capacitor 134 is isolated from bottom plate interconnect 132B. The seventh layout criterion (step 214) insures against unratioed parasitic capacitance in the interconnect lines 132A-132B. Normally the seventh layout criterion (step 214) is easily satisfied by running one interconnect 132A out the top of the row and another interconnect 132B out the bottom.

In the eighth layout criterion (step 216), interconnects are shielded from opposite capacitor plates. FIG. 1 illustrates a top plate POLY2 interconnect 136 that is shielded from the bottom plate 121 POLY1 of the same capacitor. Sometimes, it is necessary to run an interconnect 136 a short distance next to the opposite plate from the same capacitance (e.g., a POLY2 plate interconnect is run next to a POLY1 plate). These runs should be as short as possible. However, to insure that the parasitic capacitance is minimized, the interconnect line 136 must be shielded from the POLY1 plate by a parallel ground line. The ground lines are readily available from the dummy capacitor interconnects 140. This provides both an additional spacing and a shielding effect. Models indicate that the shielding effect reduces parasitic capacitance more than two times (2×).

In the ninth layout criterion (step 218), rows of unit capacitors of the same capacitance are isolated from each other. This criterion is not necessary in most cases. However, for greatest accuracy, it is important to minimize fringe capacitance between the POLY2 plates of one row and the POLY1 plate of another row where the same capacitance comprises the two rows. This is done by placing a row of unit capacitors from one or more other capacitances between these two rows. This is shown in FIG. 1 where the two rows 110 and 150 of capacitance $C_D$ are separated by the intervening row of capacitance $C_B$. The interspersed rows act as a shield and also greatly increase the fringing distance. The ninth layout criterion (step 218) applies to large capacitances requiring two or more rows of unit capacitors.

The layout example according to the present invention shown in FIG. 1 is representative of a single metal process. However, some improvements can be made in a double metal process. The first layer of metal is used as a grounded shield to completely cover the capacitor array. Holes are cut in the first metal (containing square patches of first metal, if necessary to meet via and contact design criterion) to provide contact openings for the second metal that is the interconnect layer. The use of the shield allows closer vertical spacing of capacitor rows, since interconnects can run anywhere above the shield without fringing to the capacitor plates. It also eliminates the need for criteria 3-5, 8, and 9 (steps 206-210, 216, and 218).

The layout scheme according to the present invention, shown in FIG. 2, discloses an advantage of improved accuracy and reproducibility for capacitance matching in silicon integrated circuits. The improved accuracy and repeatability can be used to increase the yield at a fixed performance (e.g., linearity, dynamic range, filter selectivity), or it can be used to maintain the yield at a higher performance. Thus, the yield-performance tradeoff in these circuits is enhanced.

Another advantage of the present invention over the prior art is that, by limiting the options available for laying out matched capacitor structures, the layout process is streamlined in a manner that reduces time and, in particular, lends itself to automation. For example, any group of matched capacitances begins as a large array of unit capacitor rows. Then POLY2 plates and POLY1 sections are eliminated to form the separations between capacitances. The interconnect areas are well defined, as are the number and type of interconnects. The interconnect and ground line routings follow routine sequences.

Still another advantage of the present invention over the prior art is that less space is required for the same circuit in most cases. Initially, the use of dummy capacitors would appear to require additional space. However, in most cases, this is not true. The improved linewidth accuracy of the present invention allows the use of smaller unit capacitors, and the guard-rings of the prior art are eliminated. Also, capacitor spacings for double metal processes can be reduced from that shown in FIG. 1.

We claim:

1. A method for precise capacitance ratios comprising the steps of:
    maintaining fixed horizontal and vertical spacings for N unit capacitors, said N unit capacitors forming M groupings of unit capacitors wherein M≦N, said M groupings of unit capacitors forming a plurality of capacitances;
    placing a plurality of grounded dummy capacitors around a periphery of each of said M groupings of unit capacitors;
    using two interconnect means per unit capacitor for coupling a unit capacitor to external circuitry and to unit capacitors of one of said M groupings of unit capacitors;
    maintaining equal numbers of top and bottom external interconnect means per capacitance of said plurality of capacitances;
    making a capacitance of said external interconnect means equal to a capacitance of said internal interconnect means;
    using one or more nonunit capacitors in a largest capacitance of said plurality of capacitances in a ratio;
    isolating a top plate interconnect means of each of said plurality of capacitances from a bottom plate interconnect means of each of said same capacitances;
    shielding said interconnect means from the opposite capacitor plates; and
    isolating a plurality of rows of unit capacitors, said plurality of rows of unit capacitors forming a capacitance of said plurality of capacitances.

2. The method of claim 1 wherein said step of maintaining said fixed horizontal and vertical spacings for said N unit capacitors comprises the steps of:
    maintaining a fixed channel width for said interconnect means; and,
    spacing said N unit capacitors equidistantly for equalizing fringe capacitances.

3. The method of claim 1 wherein said step of making a capacitance of said external interconnect means equal to a capacitance of said internal interconnect means comprises the steps of:
    establishing POLY1-POLY2 underlap at minimum design criterion;
    calculating said capacitance of an external interconnect means to a POLY1 layer;
    calculating said capacitance/length of internal interconnect means to said POLY1 layer; and,
    choosing a space between said unit capacitors for equalizing said capacitances of said internal and external interconnect means.

4. The method of claim 1 wherein said step of using two interconnect means per unit capacitor comprises the steps of:
    using two interconnect means for a unit capacitor or a nonunit capacitor having an area that is greater than or equal to 1.0 and less than or equal to 1.24;
    using three interconnect means for a nonunit capacitor having an area that is greater than or equal to 1.25 and less than or equal to 1.74; and,
    using four interconnect means for a nonunit capacitor having an area that is greater than of equal to 1.75.

5. A method using a double metal process for precise capacitance ratios comprising the steps of:
    maintaining fixed horizontal and vertical spacings for N unit capacitors, said N unit capacitors forming M groupings of unit capacitors wherein M≦N, said M groupings of unit capacitors forming a plurality of capacitances;
    placing a plurality of grounded dummy capacitors around a periphery of each of said M groupings of unit capacitors;
    using two interconnect means per unit capacitor for coupling a unit capacitor to external circuitry and to unit capacitors of one of said M groupings of unit capacitors;
    using one or more nonunit capacitors in a largest capacitance of said plurality of capacitances in a ratio; and,
    isolating a top plate interconnect means of each of said plurality of capacitances from a bottom plate interconnect means of each of said same capacitances.

6. The method of claim 5 wherein said step of maintaining said fixed horizontal and vertical spacings for said N unit capacitors comprises the steps of:
    maintaining a fixed channel width for said interconnect means; and,
    spacing said N unit capacitors equidistantly for equalizing fringe capacitances.

* * * * *